United States Patent
Ojala

(10) Patent No.: US 7,057,241 B2
(45) Date of Patent: Jun. 6, 2006

(54) REVERSE-BIASED P/N WELLS ISOLATING A CMOS INDUCTOR FROM THE SUBSTRATE

(75) Inventor: Pekka Ojala, Fremont, CA (US)

(73) Assignee: Exar Corporation, Fremont, CA (US)

( * ) Notice: Subject to any disclaimer, the term of this patent is extended or adjusted under 35 U.S.C. 154(b) by 616 days.

(21) Appl. No.: 10/326,364

(22) Filed: Dec. 20, 2002

(65) Prior Publication Data

US 2006/0065947 A1     Mar. 30, 2006

(51) Int. Cl.
*H01L 31/119* (2006.01)

(52) U.S. Cl. ........................ 257/379; 257/531

(58) Field of Classification Search .............. 257/371, 257/372, 531, 544, 546, 548, 277, 379
See application file for complete search history.

(56) References Cited

U.S. PATENT DOCUMENTS 6,060,752 A * 5/2000 Williams .................. 257/355
6,441,442 B1 * 8/2002 Wong ...................... 257/371
2002/0179977 A1 * 12/2002 Wong et al. ............... 257/371

* cited by examiner

*Primary Examiner*—Minh-Loan Tran
(74) *Attorney, Agent, or Firm*—Townsend and Townsend and Crew LLP

(57) ABSTRACT

A double well structure beneath an inductor to isolate it from the substrate. Contacts are provided for the deeper well and the substrate, to reverse bias the junction between the substrate and the deep well. In one embodiment, for a P-substrate, the deep well is an N-well, and the other well is a P-well. Both the N-well junction with the substrate, and the junction between the N-well and the P-well are reverse biased. This improves the quality factor of the inductor structure above the wells by reducing eddy currents. In one embodiment, the P-well is striped. The deeper N-well extends upward into the gaps between the stripes. The stripes will further reduce the amount of eddy current by adding a reverse biased sidewall junction to the eddy current path, further helping to increase the quality factor of the inductor.

6 Claims, 2 Drawing Sheets

REVERSE-BIASED P/N WELLS ISOLATING A CMOS INDUCTOR FROM THE SUBSTRATE

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to forming inductors in indicated circuits, and in particular to isolating such inductors from the substrate to improve the quality factor and insensitivity to noise.

A monolithic inductor can be implemented with a standard CMOS manufacturing process by employing coils on one or more metal layers in a series or parallel configuration. These coils can be square, octagonal or an approximately circular shape within the limits of the minimum feature size in the patterning lithography used. Thicker than usual metal layers or the connection of multiple parallel metal layers can be used to reduce the series resistance of the inductor in order to make it appear closer to an ideal inductive element. In order to reduce the total capacitance within the inductor loops, and from the inductor to the substrate, a number of inner metal loops can be removed to create a center core opening, which increases the self-resonance frequency (which is the frequency above which the device reactance is dominated by the capacitance).

Quality factor (Q) is an important figure of merit for the inductor in circuit applications. Q measures how closely the inductor behaves to an ideal inductive element. Quality factor is defined from the ratio of the stored energy in the electromagnetic field of the device versus the dissipated power in the device per unit time as shown in Equation 1.

$$Q = \omega \cdot E_{tot} P_{ave} = \omega \cdot (\tfrac{1}{2} \cdot 1_{pk}^2 R). \quad \text{Equation 1}$$

Hence the quality factor of the inductor can be determined from the ratio of the inductive reactance to series resistance at a specific frequency, as in Equation 2 when the reduction in Q due to self-resonance or substrate losses are not included.

$$Q = \omega \cdot L/R, \text{ where} \quad \text{Equation 2}$$

L is inductance value, R is series resistance value, $\omega = 2\pi f$ and f is the signal frequency.

A monolithic inductor is susceptible to noise from surrounding circuit elements. These circuit elements can couple to the inductor voltage and current via the electromagnetic field that is induced by the inductor. Coupling can be either capacitive via parasitic device capacitances or inductive from magnetic field coupling. The substrate under the inductor is the only circuit feature that cannot be moved further away from the metal layers of the inductor by design optimization, and hence it presents the dominant contributor to the noise that is coupled to the inductor. Noise in the substrate is generated by any other circuit element that is fabricated on the same substrate.

A standard CMOS process employs a relatively low resistivity substrate. A monolithic inductor is usually built using the top metal layers of the fabrication process in order to remove the device from the vicinity of the substrate. However, the magnetic field that is induced by the inductor has a long range compared with a typical process cross-section. This causes the inductor magnetic field to extend into the substrate. The magnetic field coupling with the substrate generates eddy currents in the substrate and degrades the monolithic inductor quality factor by increasing the inductor losses.

Optimization of the monolithic inductor for use in circuits requires maximizing the quality factor and minimizing the noise pickup from the substrate.

One technique used for reducing the capacitive coupling aspect of an inductor is shown in U.S. Pat. No. 6,133,079. This uses a P-well within an N-well, with the wells left floating.

SUMMARY OF THE INVENTION

The present invention provides a double well structure beneath an inductor to isolate it from the substrate. Contacts are provided for the deeper well and the substrate, to reverse bias the junction between the substrate and the deep well.

In one embodiment, for a P-substrate, the deep well is an N-well, and the other well is a P-well. Both the N-well junction with the substrate, and the junction between the N-well and the P-well are reverse biased. This improves the quality factor of the inductor structure above the wells by reducing eddy currents.

In one embodiment, the P-well is striped. The deeper N-well extends upward into the gaps between the stripes. The stripes will further reduce the amount of eddy current by adding a reverse biased sidewall junction to the eddy current path, further helping to increase the quality factor of the inductor.

For a further understanding of the nature and advantages of the invention, reference should be made to the following description taken in conjunction with the accompanying drawings.

DETAILED DESCRIPTION OF THE INVENTION

In a CMOS manufacturing process, an implanted N-well structure can be used to isolate a region of the semiconductor from the surrounding P-type substrate with a reverse biased PN-junction. The present invention adds another well with an opposite type of implant polarity within the previously mentioned N-well, forming a double well structure. The N-type well extends deeper into the semiconductor from the surface and is referred to here as deep N-well and second P-type well resides within the deep N-well extending to the surface of the semiconductor silicon (above which are the dielectric, oxide layers). The P-type well implant compensates the surface of the N-type well, leading to a residual P-type doping concentration in the surface of the silicon semiconductor. The PN-junction that is formed between the P-well and the deep N-well structures is usually reverse biased in order to isolate the two wells and the substrate.

Figure 1:
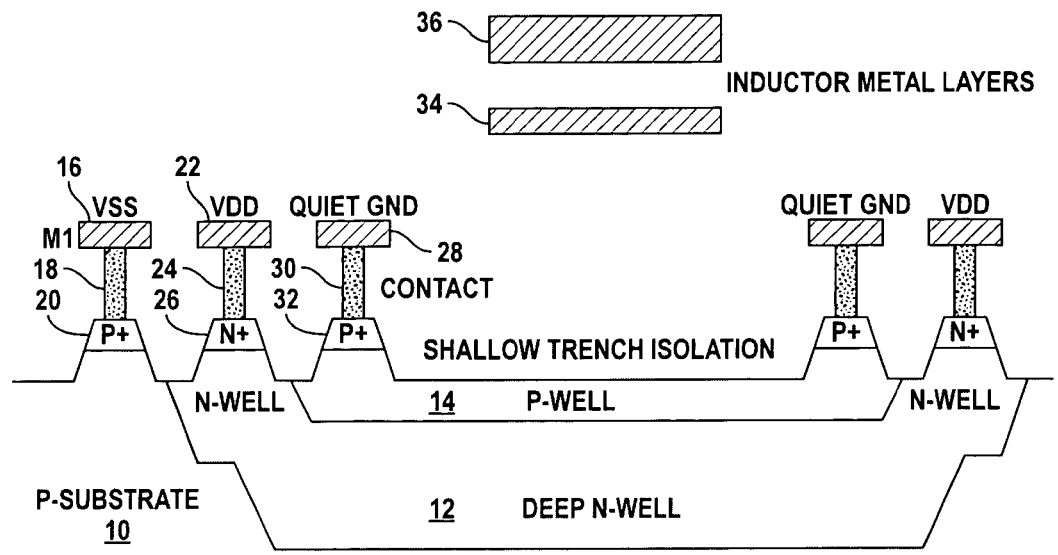
FIG. 1 is a cross-sectional view of a double well structure according to an embodiment of the invention.

FIG. 1 presents the cross-section of the P-well and deep N-well structure that is used below the inductor metal layers. FIG. 1 is drawn for a fabrication process that uses shallow trench isolation (STI) to isolate active devices, although local oxidation (LOCOS) isolation would be as suitable as long as the double well structure is created.

Hence, by employing a deep N-well and P-well under the monolithic inductor a barrier for noise can be built. Preferably, in a circuit application, the deep N-well is connected to the highest available potential and the P-substrate is connected to the lowest available potential. The P-well can be left floating or it can be connected to a quiet low voltage line.

Thus, FIG. 1 shows a P-substrate 10 and a deep N-well 12. Formed within the deep N-well 12 is a P-well 14. Contacts 16 to the substrate connect a metal 1 layer (M1) through a metal interconnect 18 to a P+ contact region 20. This is connected to the lowest available voltage, typically the negative voltage Vss.

A contact 22 in M1 for the N-well is similarly connected through an interconnect 24 and an N+ region 26. Finally, a contact 28 for the P-well in M1 is connected through an interconnect 30 and a P+region 32.

The inductor metal layers 34 and 36, shown above, are formed in the appropriate coil or other arrangement in the layers above the double-well structure. The details of these layers are well known, and are not shown here to avoid obscuring the inventive features.

The double well structure will increase the quality factor of the inductor when compared with the same inductor on top of a P-type substrate without reverse biased well structures. This follows from the higher resistivity of the P-well when compared to the P-type substrate. An equivalent circuit model can be built for the inductor as shown in FIG. 2.

Figure 2:
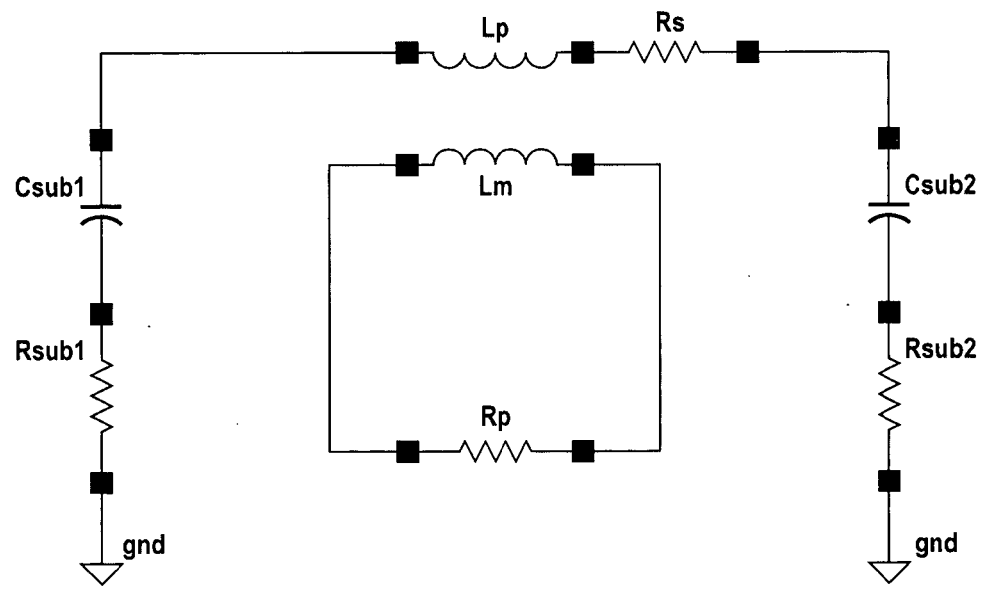
FIG. 2 is an inductor equivalent circuit model of the structure of FIG. 1.

In FIG. 2 the component Rp models the effective substrate resistance beneath the inductor. The signal in the inductor is coupled to the substrate by the magnetic field that induces eddy currents in the substrate. Eddy currents in the substrate cause a loss to the available inductor signal and therefore increase the average dissipated power. If the substrate resistance (Rp) can be increased, the amount of eddy currents can be reduced. The P-well inside the deep N-well has a higher resistivity than the P-type substrate, therefore it will reduce the eddy currents and increase the quality factor of the inductor. The resistivity of the P-well is higher than the resistivity of the P-substrate since it is a relatively thin layer with a controlled doping concentration.

Figure 3:
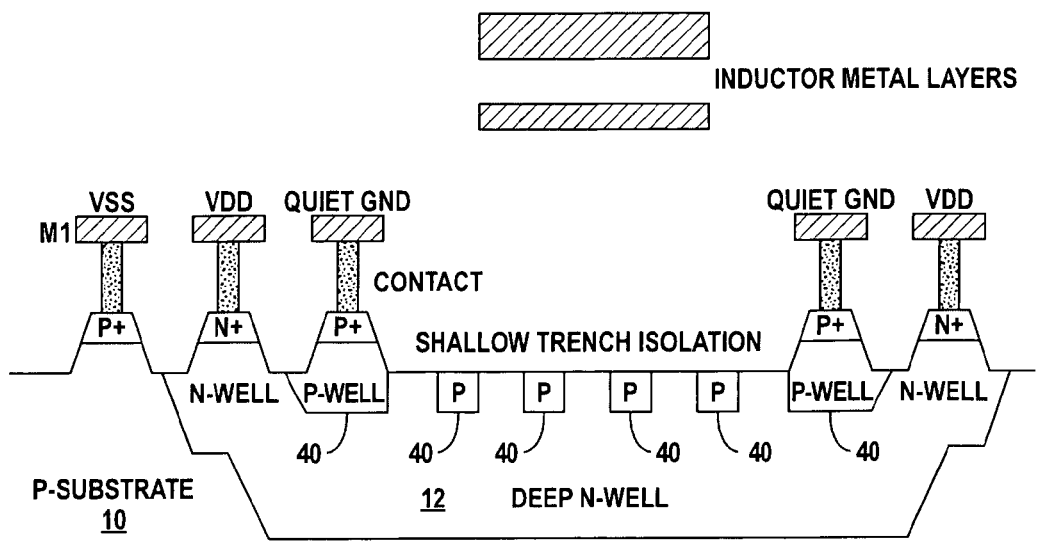
FIG. 3 is a variation of the embodiment of FIG. 1 wherein the P-well is striped.

FIG. 3 is a cross-sectional view through the center of a structure according to an alternate embodiment in which the P-well is divided into a number of stripes 40. Although not shown in this cross-sectional view, the stripes are connected at one end, or could be alternately connected in a zig zag or star pattern. The N-well extends up in between the stripes to the normal surface of the P-well, below the above inductor structure. The stripes will further reduce the amount of eddy current flowing in the substrate by adding reverse biased sidewall junctions into the eddy current path, which will further help to increase the quality factor of the inductor. The minimum width and spacing of the stripes is process dependent.

Figure 4:
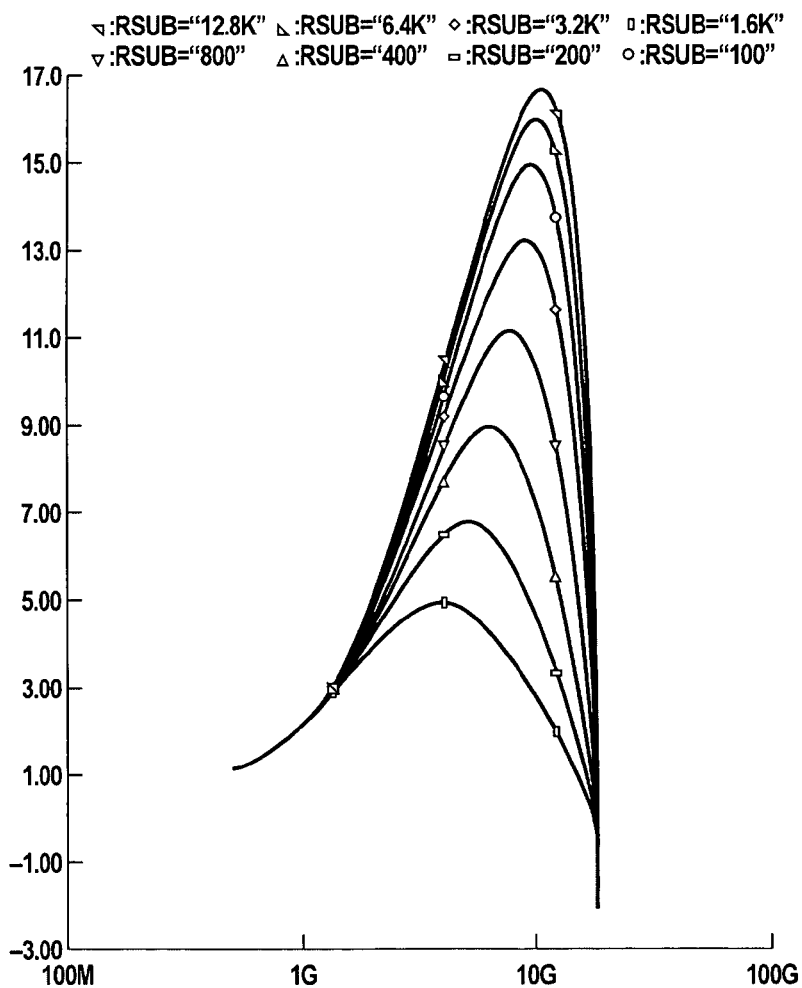
FIG. 4 is simulation results showing the increased quality factor provided by the present invention.

FIG. 4 presents the simulated enhancement of the inductor Q with respect to substrate resistance due to the invention. The substrate resistance increases from bottom to top, and similarly Q increases with higher substrate resistance. The initial increase in the quality factor curves with respect to frequency is due to frequency dependent reactance (ωL) increasing with frequency, and the eventual reduction in Q follows from substrate losses that increase at higher frequencies and from increasing peak electric energy due to capacitive reactance. These will cause Q to vanish at the self-resonance frequency.

As will be understood by those of skill in the art, the present invention may be embodied in other forms without departing from the essential characteristics thereof. For example, a semiconductor structure with an N-type of substrate would have the well types reversed with the deep well being a P-well, and the shallower well being an N-well. The contacts could be formed in other layers of metal, or could be formed in polysilicon. Accordingly, the foregoing description is intended to be illustrative, but not limiting, of the scope of the invention which is set forth in the following claims.

What is claimed is:

1. An inductor structure comprising:
   an inductor formed over a substrate;
   a first well having a first type of polarity formed in said substrate between said substrate and said inductor;
   a second well of a second type of polarity formed in said first well between said first well and said inductor; and
   a first contact coupled to said first well to bias said first well wherein said second well is striped, with said first well extending upward into gaps between the stripes of said second well.

2. An inductor structure comprising:
   an inductor formed over a substrate;
   a first well having a first type of polarity formed in said substrate between said substrate and said inductor;
   a second well of a second type of polarity formed in said first well between said first well and said inductor; and
   a first contact coupled to said first well to bias said first well wherein said contact is polysilicon.

3. An inductor structure comprising:
   an inductor formed over a substrate;
   an n-well formed in said substrate between said substrate and said inductor;
   a p-well formed in said n-well between said n-well and said inductor, wherein said p-well is striped, with said n-well extending upward into gaps between the stripes of said p-well;
   a first contact coupled to said n-well to bias said n-well to a supply voltage; and
   a second contact coupled to said substrate to bias said substrate to a lower voltage than said supply voltage, such that a junction between said n-well and said substrate is reverse biased.

4. The structure of claim 3 wherein said supply voltage is a highest available voltage on a chip, and said lower voltage is a lowest available voltage on said chip.

5. The structure of claim 3 further comprising a third contact connected to said p-well for biasing said p-well or leaving it floating.

6. The structure of claim 3 wherein said p-well has a higher resistivity than said substrate.

* * * * *